(12) United States Patent
Shastry et al.

(10) Patent No.: US 9,473,178 B2
(45) Date of Patent: Oct. 18, 2016

(54) SYSTEM AND METHOD FOR VARYING MEMORY SIZE IN A DATA STREAM PROCESSING

(71) Applicant: Tata Consultancy Services Limited, Mumbai (IN)

(72) Inventors: Addagadde Subramanya Ravishankara Shastry, Bangalore (IN); Barkur Suryanarayana Adiga, Bangalore (IN); Mariswamy Girish Chandra, Bangalore (IN)

(73) Assignee: Tata Consultancy Services Limited (IN)

( * ) Notice: Subject to any disclaimer, the term of this patent is extended or adjusted under 35 U.S.C. 154(b) by 226 days.

(21) Appl. No.: 14/281,142

(22) Filed: May 19, 2014

(65) Prior Publication Data

US 2014/0344651 A1 Nov. 20, 2014

(30) Foreign Application Priority Data

May 20, 2013 (IN) .......................... 1779/MUM/2013

(51) Int. Cl.
| | |
|---|---|
| *H03M 13/03* | (2006.01) |
| *H03M 13/35* | (2006.01) |
| *H04N 21/2343* | (2011.01) |
| *H04N 21/2383* | (2011.01) |
| *H03M 13/13* | (2006.01) |
| *H03M 13/15* | (2006.01) |
| *H03M 13/23* | (2006.01) |

(52) U.S. Cl.
CPC ....... *H03M 13/353* (2013.01); *H04N 21/2383* (2013.01); *H04N 21/23439* (2013.01); *H03M 13/136* (2013.01); *H03M 13/152* (2013.01); *H03M 13/1515* (2013.01); *H03M 13/23* (2013.01)

(58) Field of Classification Search
CPC ......... H03M 13/136; H03M 13/1515; H03M 13/152; H03M 13/23; H03M 13/353; H04N 21/23439; H04N 21/2383
See application file for complete search history.

(56) References Cited

U.S. PATENT DOCUMENTS

| | | | |
|---|---|---|---|
| 7,751,325 B2 | 7/2010 | Krishnamurthy | |
| 2010/0046383 A1* | 2/2010 | Williams | ............ H04L 12/5693 370/252 |
| 2011/0239299 A1 | 9/2011 | Chen et al. | |

OTHER PUBLICATIONS

Robert Schweller, Yan Chen, Elliot Parsons, Ashish Gupta, Gokhan Memik and Yin Zhang, "Reverse Hashing for Sketch-based Change Detection on High-speed Networks", 2004.
Robert Schweller, Ashish Gupta, Elliot Parsons, Yan Chen, "Reversible Sketches for Efficient and Accurate Change Detection over Network Data Streams" 2004.

* cited by examiner

*Primary Examiner* — Guy Lamarre
(74) *Attorney, Agent, or Firm* — Finnegan, Henderson, Farabow, Garrett & Dunner, LLP

(57) ABSTRACT

The present disclosure relates to methods, systems, and computer-readable media for varying a memory size in a data stream processing while improving a connection degree sketch. Embodiments of the present disclosure may encode an input data by using an error coding technique to produce an encoded data, wherein the encoded data results in a modified memory size; generate a host connectivity using a set of parameters and applying a reverse sketching technique over the encoded data in order to obtain estimated encoded data; and decode the encoded data after the host connectivity is established using a decoding technique and obtaining an output data. The memory size of the output data may be proportional to the memory size of the input data.

14 Claims, 4 Drawing Sheets

SYSTEM AND METHOD FOR VARYING MEMORY SIZE IN A DATA STREAM PROCESSING

PRIORITY CLAIM

This U.S. patent application claims priority under 35 U.S.C. §119 to: Indian Patent Application No. 1779/MUM/2013, filed May 20, 2013. The aforementioned applications are incorporated herein by reference in their entirety.

TECHNICAL FIELD

This disclosure relates to a field of data stream processing. More particularly, the disclosure relates to varying a memory size in a data stream processing while improving a connection degree sketch.

BACKGROUND

Network traffic anomalies such as failures and attacks are common in today's network. Identifying network traffic anomalies rapidly and accurately is important for large network operators. Estimation of the connection degree identifies hosts that are responsible for anomalies like DDOS (Distributed Denial-Of-Service), flash crowds and network failures.

Depending on traffic volume and link speeds, a suitable detection method has to be selected to identify network anomalies. Recent research efforts have been directed towards developing scalable heavy hitter detection techniques for accounting and anomaly detection purposes. Heavy hitter techniques do not correspond to flows, experiencing significant changes in the network traffic.

Researchers have developed various systems like Snort and Flowscan, for example. Snort is network intrusion prevention and detection system which utilizes rule based language combining signature, protocol and anomaly inspection methods.

Flowscan analyzes and reports on flow data exported by Internet Protocol routers. Flowscan groups PERL scripts and elements such as flow collection engine, a high performance database, and a visualization tool. After all the tools are assembled, the Flowscan system produces graphic images, appropriate for use in web pages. Flowscan provides a continuous, near real-time view of the network traffic through a network's border. However, these systems are not suitable because of the massive amount of network traffic in high-speed links.

Further, data monitoring algorithms based on efficient data structures have been in use for high traffic user detection and traffic-volume queries. The data monitoring algorithms allow monitoring of data network traffic without tracking data individually for each separate key. The data monitoring algorithm utilizes parallel hash tables to identify large flows using a memory that is only a small constant and larger than the number of large flows. However, this technique only detects high traffic users and does not detect users having significant changes in traffic.

Another approach in identifying network anomalies includes using data streaming techniques. The data streaming techniques locate hosts with large connection degrees. These techniques use a reversible connection degree sketch to monitor network traffic anomalies. They may use bit array operations and hash functions based on Chinese-Remainder Theorem (CRT) to create a connection degree sketch of network data stream. However, the quality of the results may be reduced by false positives and false negatives.

SUMMARY

This summary is provided to introduce concepts related to system and method for varying a memory size in data stream processing to improve connection degree sketch and the concepts are further described below in the detailed description. This summary is not intended to identify essential features of the claimed subject matter nor is it intended for use in determining or limiting the scope of the claimed subject matter.

Certain embodiments of the present invention relate to a computer-implemented method for varying a memory size in a data stream processing while improving a connection degree sketch, the method may comprise: encoding an input data by using an error coding technique to produce an encoded data, wherein the encoded data results in a modified memory size; generating a host connectivity using a set of parameters and applying a reverse sketching technique over the encoded data in order to obtain estimated encoded data; and decoding the encoded data after the host connectivity is established using a decoding technique and obtaining an output data, wherein a memory size of the output data is proportional to the memory size of the input data.

Certain embodiments of the present invention also relate to a system for varying a memory size in a data stream processing while improving a connection degree sketch, the system may comprise: a processor; and a memory storing instructions that, when executed by the processor, may cause the processor to perform a method, the method comprising: encoding an input data by using an error coding technique to produce an encoded data, wherein the encoded data results in a modified memory size; generating a host connectivity using a set of parameters and applying a reverse sketching technique over the encoded data in order to obtain estimated encoded data; and decoding the encoded data after the host connectivity is established using a decoding technique and obtaining an output data, wherein a memory size of the output data is proportional to the memory size of the input data.

Certain embodiments of the present invention also relate to a non-transitory, computer-readable medium, having stored thereon instructions that, when executed by a processor, may cause the processor to perform a method, the method may comprise: encoding an input data by using an error coding technique to produce an encoded data, wherein the encoded data results in a modified memory size; generating a host connectivity using a set of parameters and applying a reverse sketching technique over the encoded data in order to obtain estimated encoded data; and decoding the encoded data after the host connectivity is established using a decoding technique and obtaining an output data, wherein a memory size of the output data is proportional to the memory size of the input data.

BRIEF DESCRIPTION OF THE DRAWINGS

The detailed description is described with reference to the accompanying figures. The same numbers are used throughout the drawings to refer like features and components.

DETAILED DESCRIPTION

Systems and methods for varying memory size in data stream processing to improve connection degree sketch are described. The system and method may receive input data such as IP address, TV program, or pairs of location identifiers and channel identifiers. The length of the address may be encoded in order to increase memory size of the input data using error control technique. The error control techniques may include Hamming, Bose, Chaudhuri and Hocquenghem (BCH), Reed-Solomon, Low Density Parity-Check (LDPC), Reed-Muller, Convolutional codes.

A connection degree sketch of the encoded input data may be built using the bit arrays of appropriate dimensions and hash functions based on Chinese-Remainder Theorem (CRT). For each encoded input data, several bits may be set in the connection degree by group of hash functions. By using the reversible property of the connection degree sketch, the system may properly estimate in-degree and out-degree associated with each input.

An appropriate decoding technique may be selected in order to decode the encoded data, resulting in the decoded data being of the length of the original input data. The estimation of a connection degree using error control technique and applying reverse connection degree sketch may be extended to TV programs that may reduce false positives and false negatives in the final result.

While aspects of described system and method for varying memory size in data stream processing be implemented in any number of different computing systems, environments, and/or configurations, the embodiments may be described in the context of the following exemplary system.

Figure 1:
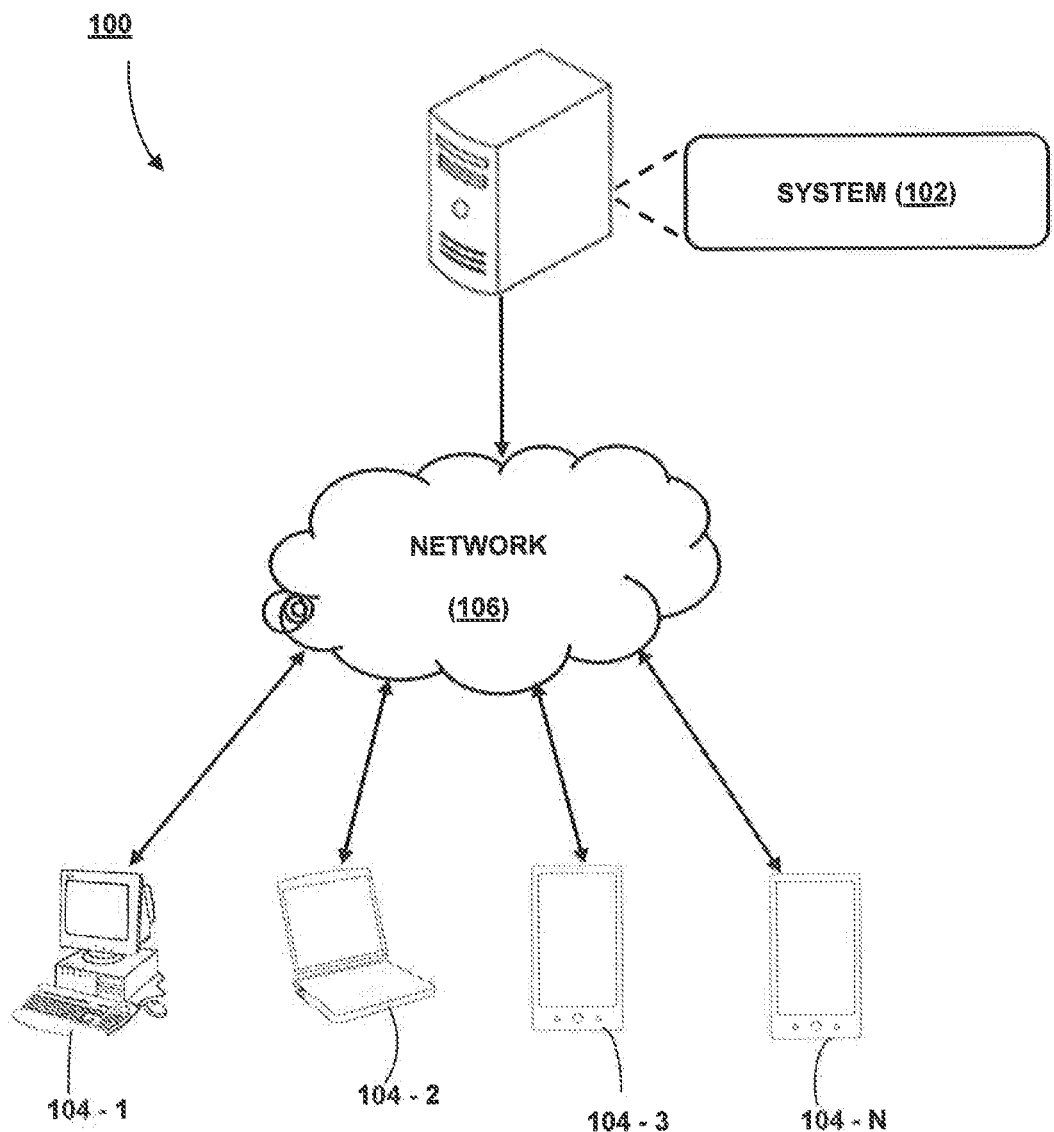
FIG. 1 illustrates an exemplary network implementation of a system for varying memory size in data stream processing, in accordance with an embodiment of the present subject matter.

Referring now to FIG. 1, a network implementation 100 of a for varying memory size in data stream processing to improve connection degree sketch may be illustrated, in accordance with an embodiment of the disclosure. In one embodiment, the system may receive input data such as IP address or TV program. The input data may be of the length k bit. The system may encode the input data using error control technique. The input data of k bit length may be increased n bit length upon encoding the data, resulting in n bits being greater than k bits. The encoded n bits may be sent to build a connection degree sketch.

The system may facilitate in building a connection degree sketch using bit arrays and hash functions based on Chinese-Remainder Theorem (CRT). The connection degree sketch may build a compact summary of host connection degrees efficiently and accurately. Reverse sketching technique may be applied using Chinese-Remainder Theorem (CRT) on the encoded data. The encoded data may be decoded using decoding technique. Upon decoding, the output of the encoded data may be received as k bits length similar to the input data.

Although the present subject matter may be explained by considering a scenario that the system 102 may be implemented as an application on a server. It may be understood that the system 102 may also be implemented in a variety of computing systems, such as a laptop computer, a desktop computer, a notebook, a workstation, a mainframe computer, a server, a network server, and the like. It may be understood that the system 102 may be accessed by multiple users through one or more user devices 104-1, 104-2 . . . 104-N, collectively referred to as user devices 104 hereinafter, or applications residing on the user devices 104. Examples of the user devices 104 may include, but are not limited to, a portable computer, a personal digital assistant, a handheld device, and a workstation. The user devices 104 may be communicatively coupled to the system 102 through a network 106.

In one implementation, the network 106 may be a wireless network, a wired network or a combination thereof. The network 106 can be implemented as one of the different types of networks, such as intranet, local area network (LAN), wide area network (WAN), the internet, and the like. The network 106 may either be a dedicated network or a shared network. The shared network may represent an association of the different types of networks that use a variety of protocols, for example, Hypertext Transfer Protocol (HTTP), Transmission Control Protocol/Internet Protocol (TCP/IP), Wireless Application Protocol (WAP), etc., to communicate with one another. Further the network 106 may include a variety of network devices, including routers, bridges, servers, computing devices, storage devices, etc.

Figure 2:
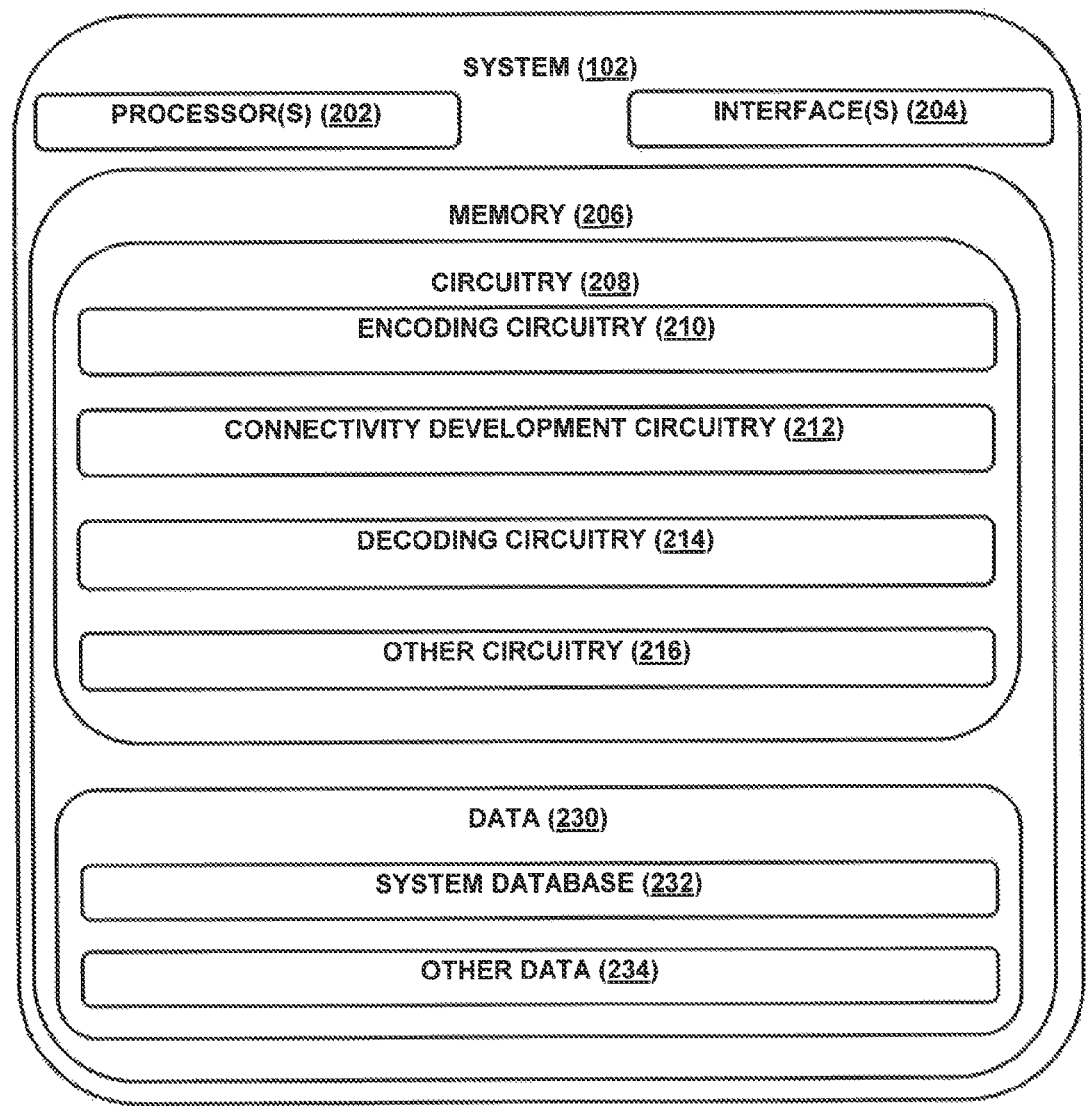
FIG. 2 illustrates an exemplary system, in accordance with an embodiment of the present subject matter.

Referring now to FIG. 2, the system 102 may be illustrated in accordance with an embodiment of the present subject matter. In one embodiment, the system 102 may include at least one processor 202, an input/output (I/O) interface 204, and a memory 206. Then at least one processor 202 may be implemented as one or more microprocessors, microcomputers, microcontrollers, digital signal processors, central processing units, state machines, logic circuitries, and/or any devices that manipulate signals based on operational instructions. Among other capabilities, at least one processor 202 may be configured to fetch and execute computer-readable instructions stored in the memory 206.

The I/O interface 204 may include a variety of software and hardware interfaces, for example, a web interface, a graphical user interface, and the like. The I/O interface 204 may allow the system 102 to interact with a user directly or through the user devices 104. Further, the I/O interface 204 may enable the system 102 to communicate with other computing devices, such as web servers and external data servers (not shown). The I/O interface 204 can facilitate multiple communications within a wide variety of networks and protocol types, including wired networks, for example, LAN, cable, etc., and wireless networks, such as WLAN, cellular, or satellite. The I/O interface 204 may include one or more ports for connecting a number of devices to one another or to another server.

The memory 206 may include any computer-readable medium known in the art including, for example, volatile memory, such as static random access memory (SRAM) and dynamic random access memory (DRAM), and/or nonvolatile memory, such as read only memory (ROM), erasable programmable ROM, flash memories, hard disks, optical disks, and magnetic tapes. The memory 206 may include circuitry 208 and data 230.

The circuitry 208 may include routines, programs, objects, components, data structures, etc., implemented in hardware, software, or a combination of both. Circuitry 208 may perform particular tasks or implement particular abstract data types. For example, circuitry 208 may be an application specific integrated circuit (ASIC), field-programmable gate array (FPGA), complex programmable logic device (CPLD), Verilog or VHDL code implemented on programmable logic, or a processor coupled to memory. Other hardware circuitry is known in the art and could be used to implement circuitry 208. In one implementation, circuitry 208 may include encoding circuitry 210, connectivity development circuitry 212, decoding circuitry 214, and other circuitry 216. Other circuitry 216 may include hardware, software, or a combination of both that supplement applications and functions of the system 102.

Data 230 may serve as a repository for storing data processed, received, and generated by one or more of the circuitry 208. Data 234 may also include a system database 232 and other data 234. Other data 234 may include data generated as a result of the execution of one or more circuitries in the other circuitry 216.

Figure 3:
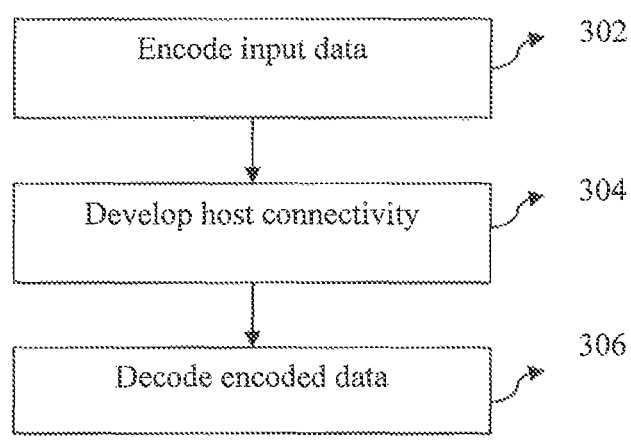
FIG. 3 is a flow chart of an exemplary method for varying memory size in data stream processing, in accordance with an embodiment of the present subject matter.

In some embodiments, referring to FIG. 2 and FIG. 3, the system 102 includes the encoding circuitry 210 that may encode an input data (as shown at step 302) by using an error coding technique to produce an encoded data. The input data may include an IP address, TV programs, or pairs of location identifiers and channel identifiers. The error control coding techniques may include Hamming, Bose, Chaudhuri and Hocquenghem (BCH), Reed-Solomon, Low Density Parity-Check (LDPC), Reed-Muller, Convolutional codes.

The encoding circuitry 210 may take k bit input and may produce n bit encoded output by adding (n–k) redundant bits. There may be many possibilities to choose the code.

In one embodiment, the system can use BCH code with appropriate rate. For example, if the system 102 chooses a rate of ½, 32-bit input may be changed to 64-bit encoded block resulting in a memory expansion by a factor of 2.

In another embodiment, the system can also use Reed-Solomon codes, where k symbols may be encoded into n symbols where each symbol corresponds to a group of bits. For example, a symbol can be a group of 8 bits.

In the following paragraphs, discuss an exemplary example of applying BCH codes:

In some embodiments, the system 102 may include connectivity development circuitry 212 that may generate host connectivity (as shown at step 304) by using a set of parameters and applying a reverse sketching technique over the encoded data. The set of parameters may include a number-of-rows a number-of-hash functions, etc. Further, reverse sketching technique may be applied using Chinese-Remainder Theorem.

The reversible sketching technique may generate a compact summary of host connection degrees efficiently and accurately. For each packet received as input, reversible sketching technique may use a set of several bits selected in a bit array by a group of hash functions. The hash functions may be designed by the connectivity development circuitry 212 based on the Chinese Remainder Theorem, resulting in the in-degree or out-degree associated with a given host being accurately estimated. By applying reverse sketch method abnormal hosts may be located. The host addresses may be reconstructed in association with large connection degrees or significant changes in connection degrees by a simple calculation purely based on the characteristics of the hash functions. In one embodiment, the modified memory size of the encoded data may further modify the size of the host connectivity.

In some embodiments, the system 102 may include the decoding circuitry 214 to decode the encoded data (as shown at step 306) after the host connectivity is developed by using a decoding technique to obtain an output data, resulting in the memory size of the output data being similar to the memory size of the input data.

An exemplary decoding procedure may include the following steps:
1. Calculate the syndromes for the received vector
2. Determine the number of errors and the error locator polynomial from the syndromes
3. Calculate the roots of the error location polynomial to find the error locations
4. Calculate the error values at hose error locations
5. Correct the errors Apart from the above mentioned decoding scheme, many variants and implementations may be available. In one embodiment, the decoding circuitry 214 may apply a decoding technique to the n-bit encoded data to detect and correct one or more anomalies in the data stream. The decoding circuitry 214 may generate a kbit output that is identical to the original input data. Depending on the coding scheme, different types and numbers of errors may be corrected in the encoded data.

The decoding technique may depend on error coding code chosen. For BCH codes the decoding technique discussed above may be used. If LDPC is selected for encoding, the decoding may be carried out by using different aspects of message passing algorithm.

Figure 4:
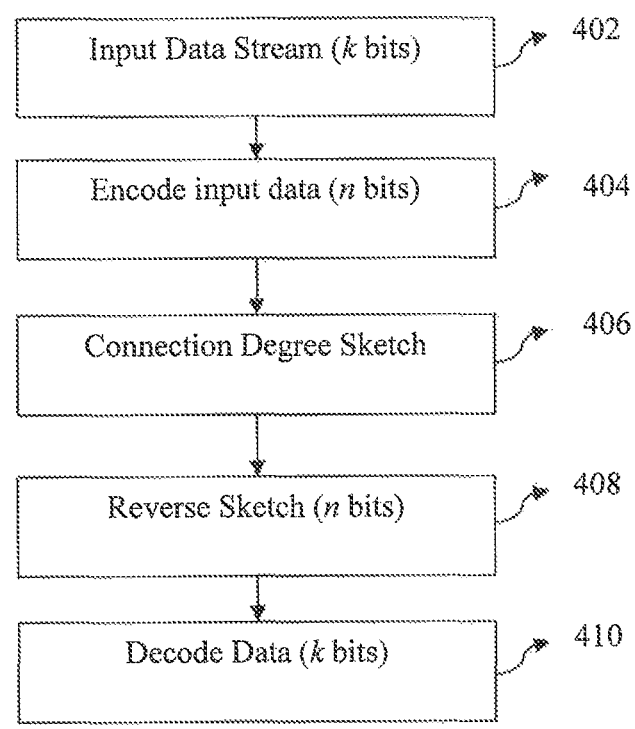
FIG. 4 is a flow chart of an exemplary method of implementing error control technique with reverse sketching technique, in accordance with an embodiment of the present subject matter.

FIG. 4 illustrates an exemplary method of implementing error control technique with reverse sketching technique according to an embodiment. System 102 may receive input data stream of length k bits (step 402). The encoding circuitry 210 may encode the input data of k bits length to n bits length (step 404), wherein the length of n bits may be greater than k bits. The encoded data may be sent to build connection degree sketch (step 406) using bit arrays and hash functions in order to find the anomalies in the input data. The reverse sketching technique may be applied (step 408) using Chinese remainder Theorem. The encoded data upon applying reverse sketching technique may reduce the false positive and the false negatives present in the output. Encoded data of n bits may be decoded (step 410) using decoding circuitry 214 resulting in the decoded data being of k bits length.

In an exemplary embodiment, varying memory size in data stream processing may improve a connection degree sketch. For example, consider an input data stream that may 200 IP addresses where each input data may have a 32 bit length. The sample exemplary results that may be obtained by building the connection degree sketch on the data and applying reverse sketch subsequently is displayed in Table 1.

TABLE 1

| Input | Output | True positives count | False positives count |
|---|---|---|---|
| 0.1.4.4 | 0.1.4.4 | 1 | 4 |
| 0.2.4.3 | 0.2.4.3 | | |
| 4.6.4.3 | 4.6.4.3 | | |
| 1.3.7.16 | 0.6.6.4 | | |
| 2.1.4.17 | 1.1.7.24 | | |
| 1.2.7.11 | | | |
| 0.3.12.25 | | | |
| 1.3.4.14 | | | |
| 2.0.6.9 | | | |
| 2.1.2.24 | | | |
| 2.2.11.5 | | | |
| 0.3.4.7 | | | |
| 1.1.3.14 | | | |
| 2.2.7.23 | | | |
| 2.2.10.10 | | | |
| 2.1.4.28 | | | |

TABLE 1-continued

| Input | Output | True positives count | False positives count |
|---|---|---|---|
| 1.0.15.14 | | | |
| 1.1.7.24 | | | |
| 2.2.12.17 | | | |
| 2.2.2.5 | | | |
| 2.1.0.15 | | | |
| 1.0.9.16 | | | |
| 1.1.0.16 | | | |
| 2.2.11.18 | | | |
| 0.1.3.14 | | | |
| 0.2.13.12 | | | |
| 2.0.5.12 | | | |
| 2.0.14.21 | | | |
| 0.1.15.4 | | | |
| 2.3.15.21 | | | |
| 1.0.11.18 | | | |
| 1.1.4.3 | | | |
| 0.2.12.11 | | | |
| 1.3.0.20 | | | |
| 0.2.2.26 | | | |
| 1.3.12.11 | | | |
| 2.1.4.28 | | | |
| 0.1.9.14 | | | |
| 0.3.6.28 | | | |
| 1.2.12.11 | | | |

Table 1 may illustrate an exemplary final result of the data stream processing without using an error control technique. The exemplary final result can be 5 IP addresses as the host with large connection degree, wherein one host 0.1.4.4 may be the only true positive and other four hosts are false positives.

For the above example, error control technique may be implemented with reverse sketching technique. BCH encoding technique may be applied to the IP addresses received as input data wherein code rate is 50 percent or 0.5. Consider the input data may be of k bit length in the high speed data stream. The k bit length of the input data may be increased to n bit length after applying error coding technique. For example, a code rate k/n may be 0.5. The encoding circuitry may encode and may increase IP addresses length from k of 32 bits to n of 64 bit. After applying reverse sketching technique, the system may send the IP addresses to decoding circuitry 214. Decoding circuitry 214 may decode the encoded data using decoding technique wherein the output of the decoded data is of the length k bits i.e., 32 bits.

TABLE 2

| Input | Output | True positives count | False positives Count |
|---|---|---|---|
| 0.1.4.4 | 0.1.4.4 | 1 | 1 |
| 0.2.4.3 | 4.6.4.3 | | |
| 4.6.4.3 | | | |
| 1.3.7.16 | | | |
| 2.1.4.17 | | | |
| 1.2.7.11 | | | |
| 0.3.12.25 | | | |
| 1.3.4.14 | | | |
| 2.0.6.9 | | | |
| 2.1.2.24 | | | |
| 2.2.11.5 | | | |
| 0.3.4.7 | | | |
| 1.1.3.14 | | | |
| 2.2.7.23 | | | |
| 2.2.10.10 | | | |
| 2.1.4.28 | | | |
| 1.0.15.14 | | | |
| 1.1.7.24 | | | |
| 2.2.12.17 | | | |

TABLE 2-continued

| Input | Output | True positives count | False positives Count |
|---|---|---|---|
| 2.2.2.5 | | | |
| 2.1.0.15 | | | |
| 1.0.9.16 | | | |
| 1.1.0.16 | | | |
| 2.2.11.18 | | | |
| 0.1.3.14 | | | |
| 0.2.13.12 | | | |
| 2.0.5.12 | | | |
| 2.0.14.21 | | | |
| 0.1.15.4 | | | |
| 2.3.15.21 | | | |
| 1.0.11.18 | | | |
| 1.1.4.3 | | | |
| 0.2.12.11 | | | |
| 1.3.0.20 | | | |
| 0.2.2.26 | | | |
| 1.3.12.11 | | | |
| 2.1.4.28 | | | |
| 0.1.9.14 | | | |
| 0.3.6.28 | | | |
| 1.2.12.11 | | | |

Using error control technique with reverse sketching technique, the amount of false positives for 200 IP addresses identified may be 2 as shown in Table 2. For example, the output may consist of one true positive and one false positive, thus showing an improvement with error coding for correction.

The specification has described systems and methods for varying a memory size in a data stream processing while improving a connection degree sketch. The exemplary steps are set out to explain the exemplary embodiments shown, and it should be anticipated that ongoing technological development will change the manner in which particular functions are performed. Thus, these examples are presented for purposes of illustration, and not limitation. For example, steps or processes disclosed herein are not limited to being performed in the order described, but may be performed in any order, and some steps may be omitted, consistent with disclosed embodiments. Further, the boundaries of the functional bodies have been arbitrarily defined herein for the convenience of the description. Alternative boundaries can be defined so long as the specified functions and relationships thereof are appropriately performed. Alternatives (including equivalents, extensions, variations, deviations, etc., of those described herein) will be apparent to persons skilled in the relevant art(s) based on the teachings contained herein. Such alternatives fall within the scope and p it of the disclosed embodiments.

Furthermore, one or more computer-readable storage media may be utilized in implementing embodiments consistent with the present disclosure. A computer-readable storage medium refers to any type of physical memory on which information or data readable by a processor may be stored. Thus, a computer-readable storage medium may store instructions for execution by one or more processors, including instructions for causing the processor(s) to perform steps or stages consistent with the embodiments described herein. The term "computer-readable medium" should be understood to include tangible items and exclude carrier waves and transient signals, i.e., be non-transitory. Examples include random access memory (RAM), read-only memory (ROM), volatile memory, nonvolatile memory, hard drives, CD ROMs, DVDs, flash drives, disks, and any other known physical storage media.

It is intended that the disclosure and examples be considered as exemplary only, with a true scope and spirit of disclosed embodiments being indicated by the following claims.

We claim:

1. A computer-implemented method for varying a memory size in a data stream processing while improving a connection degree sketch for identifying network traffic anomalies, the method comprising:
   encoding an input data stream by using an error coding technique to produce an encoded data, wherein the encoded data results in a modified memory size;
   generating a host connection degree sketch using a set of parameters and applying a reverse sketching technique over the encoded data in order to obtain estimated encoded data, wherein obtaining the estimated encoded data includes estimating in-degree and out-degree associated with one or more host in a network; and
   decoding the encoded data after the host connection degree sketch is generated using a decoding technique and obtaining an output data, wherein a memory size of the output data is dependent on the memory size of the input data stream.

2. The method of claim 1, wherein the input data comprises at least one of: an IP address, a plurality of TV programs, and a set of pairings of location identifiers and channel identifiers.

3. The method of claim 1, wherein the error coding technique comprises at least one of: Hamming, Bose, Chaudhuri and Hocquenghem (BCH), Reed-Solomon, Low Density Parity-Check (WPC), Reed-Muller, and Convolutional codes.

4. The method of claim 1, wherein the modified memory size of the encoded data is always greater than the memory size of the input data.

5. The method of claim 1, wherein the set of parameters further comprises of number-of-rows and number-of-hash functions.

6. The method of claim 1, wherein decoding permits detection and correction of one or more anomalies in the data stream.

7. The method of claim 1, wherein improving the connection degree sketch by varying a memory size in a data stream processing comprises reducing the false positives and false negatives in the estimation of connection degree associated with the one or more hosts.

8. A system for varying a memory size in a data stream processing while improving a connection degree sketch for identifying network traffic anomalies, the system comprising:
   a processor; and
   a memory storing instructions that, when executed by the processor, cause the processor to perform a method, the method comprising:
   encoding an input stream by using an error coding technique to produce an encoded data, wherein the encoded data results in a modified memory size;
   generating a host connection, degree sketch using a set of parameters and applying a reverse sketching technique over the encoded data in order to obtain estimated encoded data wherein obtaining the estimated encoded data includes estimating the in-degree and out-degree associated with one or more hosts in a network; and
   decoding the encoded data after the host connection degree sketch is generated using a decoding technique and obtaining an output data, wherein a memory size of the output data is dependent on the memory size of the input data stream.

9. The system of claim 8, wherein the input data comprises at least one of: an IP address, a plurality of TV programs, and a set of pairings of location identifiers and channel identifiers.

10. The system of claim 8, wherein the error coding technique comprises at least one of: Hamming, Bose, Chaudhuri and Hocquenghem (BCH), Reed-Solomon, Low Density Parity-Check (LDPC), Reed-Muller, and Convolutional codes.

11. The system of claim 8, wherein the modified memory size of the encoded data is always greater than the memory size of the input data.

12. The system of claim 8, wherein decoding permits detection and correction of one or more anomalies in the data stream.

13. The method of claim 8, wherein improving the connection degree sketch by varying a memory size in a data stream processing comprises reducing the false positives and false negatives in the estimation of connection degree associated with the one or more hosts.

14. A non-transitory, computer-readable medium, having stored thereon instructions that, when executed by a processor, cause the processor to perform a method, the method comprising:
   encoding an input data stream by using an error coding technique to produce an encoded data, wherein the encoded data results in a modified memory size;
   generating a host connection degree sketch using a set of parameters and applying a reverse sketching technique over the encoded data in order to obtain estimated encoded data wherein obtaining the estimated encoded data includes estimating the in-degree and out-degree associated with one or more hosts in a network; and
   decoding the encoded data after the host connection degree sketch is generated using a decoding technique and obtaining an output data, wherein a memory size of the output data is dependent on the memory size of the input data stream.

* * * * *